United States Patent
Yang

(10) Patent No.: US 10,032,855 B1
(45) Date of Patent: Jul. 24, 2018

(54) ADVANCED METAL INSULATOR METAL CAPACITOR

(71) Applicant: International Business Machines Corporation, Armonk, NY (US)

(72) Inventor: Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/399,703

(22) Filed: Jan. 5, 2017

(51) Int. Cl.
    *H01L 49/02* (2006.01)
    *H01L 27/08* (2006.01)
    *H01L 21/311* (2006.01)

(52) U.S. Cl.
    CPC ........ *H01L 28/60* (2013.01); *H01L 21/31111* (2013.01); *H01L 27/0805* (2013.01)

(58) Field of Classification Search
    CPC ...... H01L 28/40; H01L 28/75; H01L 27/0805
    USPC ........................................................ 257/532
    See application file for complete search history.

(56) References Cited

U.S. PATENT DOCUMENTS

| | | | |
|---|---|---|---|
| 5,675,184 A | 10/1997 | Matsubayashi | |
| 5,741,626 A | 4/1998 | Jain | |
| 5,879,985 A | 3/1999 | Gambino | |
| 6,287,910 B2 | 9/2001 | Lee | |
| 6,461,914 B1 | 10/2002 | Kai | |
| 6,670,237 B1 | 12/2003 | Loh | |
| 6,764,915 B2 | 7/2004 | Lee | |
| 6,836,400 B2 | 12/2004 | Abdul Ridha | |
| 7,223,654 B2 | 5/2007 | Yang | |
| 7,671,394 B2 | 3/2010 | Booth | |
| 9,253,822 B2 | 2/2016 | Lamorey | |
| 9,818,689 B1 * | 11/2017 | Zang | ................... H01L 23/5223 |
| 2001/0005612 A1 | 6/2001 | Lee | |
| 2003/0100162 A1 | 5/2003 | Kwang-Chul | |
| 2005/0269703 A1 | 12/2005 | Dunn | |
| 2013/0143379 A1 | 6/2013 | Malholtra | |
| 2017/0098606 A1 | 4/2017 | Lu | |

OTHER PUBLICATIONS

IBM Patents or Patent Applications Treated as Related.
lst of IBM Patents or Patent Applications Treated as Related.

* cited by examiner

*Primary Examiner* — Marcos D Pizarro
*Assistant Examiner* — Antonio Crite
(74) *Attorney, Agent, or Firm* — Jeffrey S LaBaw; Steven J Meyers

(57) ABSTRACT

A pattern is defined in a dielectric layer. The dielectric layer includes a low-k dielectric region and a high-k dielectric region. The high-k dielectric region includes a phase change material which is an alloy of tantalum and nitrogen and is a high-k insulator in a deposited state. The pattern includes a first set of features in the low-k dielectric region and a second set of features in the high-k dielectric region. A surface treatment process is performed on the phase change layer to produce a top surface layer having electrically conductive properties. A metal layer is deposited in the first and second set of features. Thus, a set of conductive lines is formed in the low-k dielectric region and a metal insulator metal capacitor in the high-k dielectric region.

10 Claims, 8 Drawing Sheets

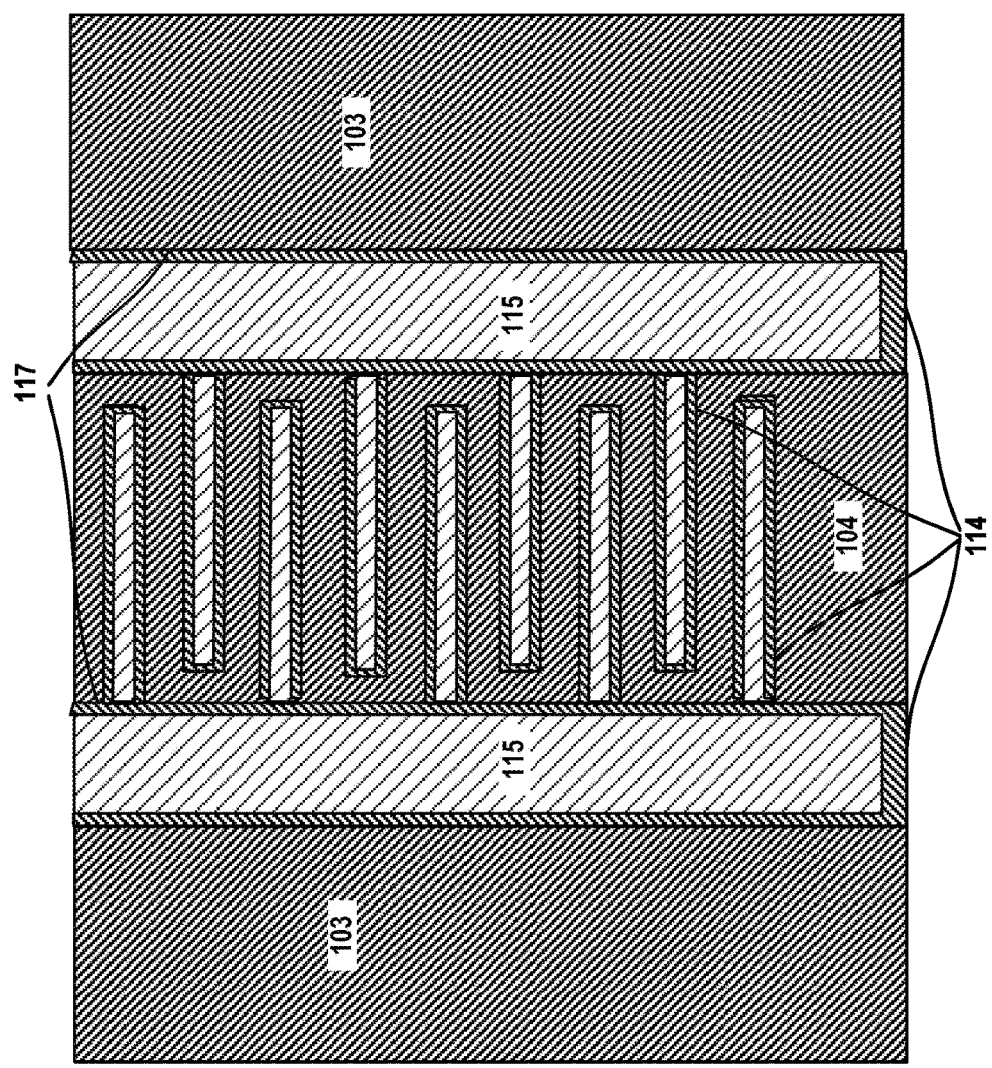

ADVANCED METAL INSULATOR METAL CAPACITOR

BACKGROUND OF THE INVENTION

This disclosure relates to integrated circuit devices, and more specifically, to a method and structure to create advanced metal conductor structures in semiconductor devices.

In many mixed signal or high frequency RF applications in integrated circuits, high performance, high speed capacitors are required. A metal insulator metal (MIM) capacitor is used commonly in high performance applications in CMOS and other semiconductor technologies. Such a capacitor has a sandwich structure and can be considered analogous to a parallel plate capacitor. The capacitor top metal (CTM) is separated from the capacitor bottom metal (CBM) by a thin insulating layer. Both of the two parallel metal plates are conventionally made from Al or AlCu alloys. These metals are patterned and etched needing several photolithography masking steps. The thin insulating dielectric layer is usually made from silicon oxide or silicon nitride deposited by chemical vapor deposition (CVD) or other deposition processes.

As the dimensions of modern integrated circuitry in semiconductor chips continues to become smaller, conventional lithography is increasingly challenged and expensive to make smaller and smaller structures. A conventional process for creating an MIM capacitor is expensive as it requires at least three additional masks (alignment mask, top electrode mask, bottom mask) to fabricate the capacitor, as well as additional including lithography and RIE processes. Further, as the dimensions of the capacitor decrease, there is a scaling challenge in maintaining the uniformity of the dielectric thickness throughout the MIM capacitor as the dielectric thickness is decreased with the rest of the device.

The present disclosure presents an advanced MIM capacitor to alleviate this problem.

BRIEF SUMMARY

According to this disclosure, an advanced MIM capacitor structure and a method for constructing the structure are described. A pattern is defined in a dielectric layer. The dielectric layer includes a low-k dielectric region and a high-k dielectric region. The high-k dielectric region includes a phase change material which is an alloy of tantalum and nitrogen and is a high-k insulator in a deposited state. The pattern includes a first set of features in the low-k dielectric region and a second set of features in the high-k dielectric region. A surface treatment process is performed on the phase change layer to produce a top surface layer having electrically conductive properties. A metal layer is deposited in the first and second set of features. Thus, a set of conductive lines is formed in the low-k dielectric region and a metal insulator metal capacitor in the high-k dielectric region.

The foregoing has outlined some of the more pertinent features of the disclosed subject matter. These features should be construed to be merely illustrative. Many other beneficial results can be attained by applying the disclosed subject matter in a different manner or by modifying the invention as will be described.

BRIEF DESCRIPTION OF THE DRAWINGS

For a more complete understanding of the present invention and the advantages thereof, reference is now made to the following descriptions taken in conjunction with the accompanying drawings which are not necessarily drawing to scale, and in which:

FIG. 8 is another top view diagram depicting the structure of the capacitor with a high-k dielectric between two adjacent metal lines after the metal fill deposition has been performed according to a second embodiment of the invention.

DETAILED DESCRIPTION OF THE DRAWINGS

Figure 1:
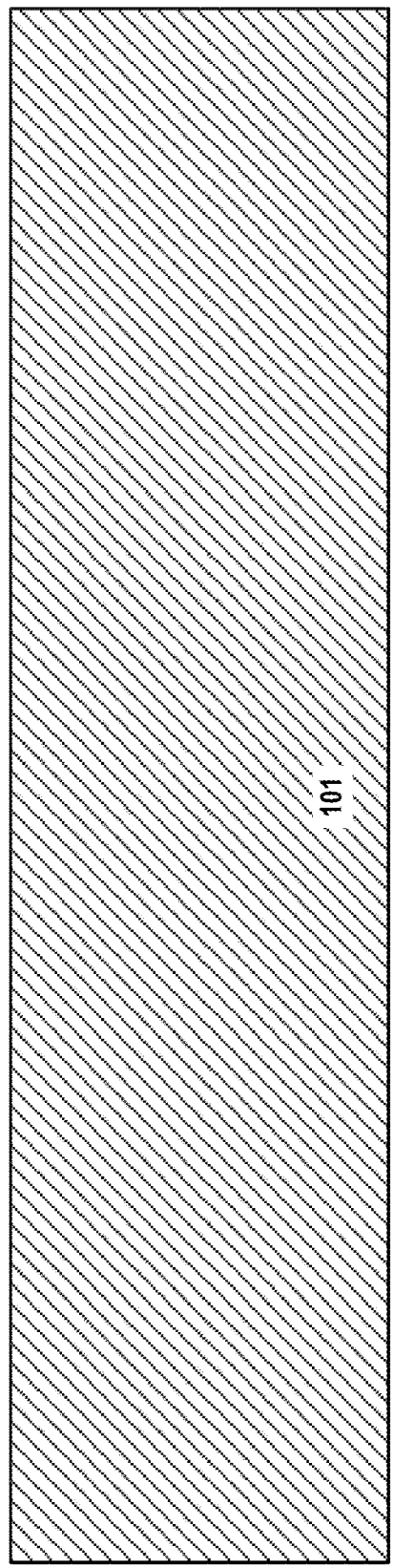
FIG. 1 is a cross-sectional diagram depicting a substrate according to a first embodiment of the invention.

At a high level, embodiments of the invention provide a MIM/VNCAP capacitor structure containing high-k dielectric and an interconnect structure containing low-k dielectric fabricated in the same level of an integrated circuit. In embodiments of the invention, a reduced insulator thickness by converting a surface portion of the insulator to a metallic material. A uniform ultra-thin insulator thickness is thus produced through a "controlled" surface treatment. This is in contrast to conventional processes in which the high-k dielectric thickness is controlled through the control of the deposition process. In embodiments of the invention, the final high-k dielectric thickness is through amount of surface treatment to reduce the original deposited high-k material.

A "substrate" as used herein can comprise any material appropriate for the given purpose (whether now known or developed in the future) and can comprise, for example, Si, SiC, SiGe, SiGeC, Ge alloys, GaAs, InAs, InP, other III-V or II-VI compound semiconductors, or organic semiconductor structures. Insulators can also be used as substrates in embodiments of the invention.

For purposes herein, a "semiconductor" is a material or structure that may include an implanted impurity that allows the material to sometimes be conductive and sometimes be a non-conductive, based on electron and hole carrier concentration. As used herein, "implantation processes" can take any appropriate form (whether now known or developed in the future) and can comprise, for example, ion implantation.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to hafnium oxide, aluminum oxide, silicon nitride, silicon oxynitride, a gate dielectric stack of SiO2 and Si3N4, and metal oxides like tantalum oxide that have relative dielectric constants above that of SiO2 (above 3.9). The dielectric can be a combination of two or more of these materials. The thickness of dielectrics herein may vary contingent upon the required device performance. The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

Electrically conductive" and/or "electrical conductor" as used through the present disclosure means a material typically having a room temperature resistivity less than about 400 μΩ-cm. As used herein, the terms "insulator" and "dielectric" denote a material having a room temperature resistivity greater than about 400 μΩ-cm.

When patterning any material herein, the material to be patterned can be grown or deposited in any known manner and a patterning layer (such as an organic photoresist aka "resist") can be formed over the material. The patterning layer (resist) can be exposed to some form of light radiation (e.g., patterned exposure, laser exposure) provided in a light exposure pattern, and then the resist is developed using a chemical agent. This process changes the characteristic of the portion of the resist that was exposed to the light. Then one portion of the resist can be rinsed off, leaving the other portion of the resist to protect the material to be patterned. A material removal process is then performed (e.g., plasma etching) to remove the unprotected portions of the material to be patterned. The resist is subsequently removed to leave the underlying material patterned according to the light exposure pattern.

For purposes herein, "sidewall structures" are structures that are well-known to those ordinarily skilled in the art and are generally formed by depositing or growing a conformal insulating layer (such as any of the insulators mentioned above) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as a sidewall structure. The sidewall structures can be used as masking structures for further semiconducting processing steps.

Embodiments will be explained below with reference to the accompanying drawings.

FIG. 1 is a cross-sectional diagram depicting a substrate according to a first embodiment of the invention. In preferred embodiments of the invention, a low-k dielectric layer 101 is provided over a substrate (not pictured). The low-k dielectric layer 101 may comprise, for example, Dow SiLK™, JSR™ dielectrics, porous dielectrics, silicon dioxide (SiO2), hydrogen silsesquioxane polymer (HSQ), methyl silsesquioxane polymer (MSQ) and polyphenylene oligomer (SiOx(CH3)y), hydrogen doped silica glass (SiCOH), plasma-enhanced silicon nitride (PSiNx) or NBLoK (SiC(N,H). Suitable thicknesses of the dielectric layer 101 may be, for example, between about 50 nm and about 5000 nm thick. A low-k dielectric material has a relative permittivity of about 4 or less. Lower levels of the substrate may include device regions as well as connecting metallurgy.

Figure 2:
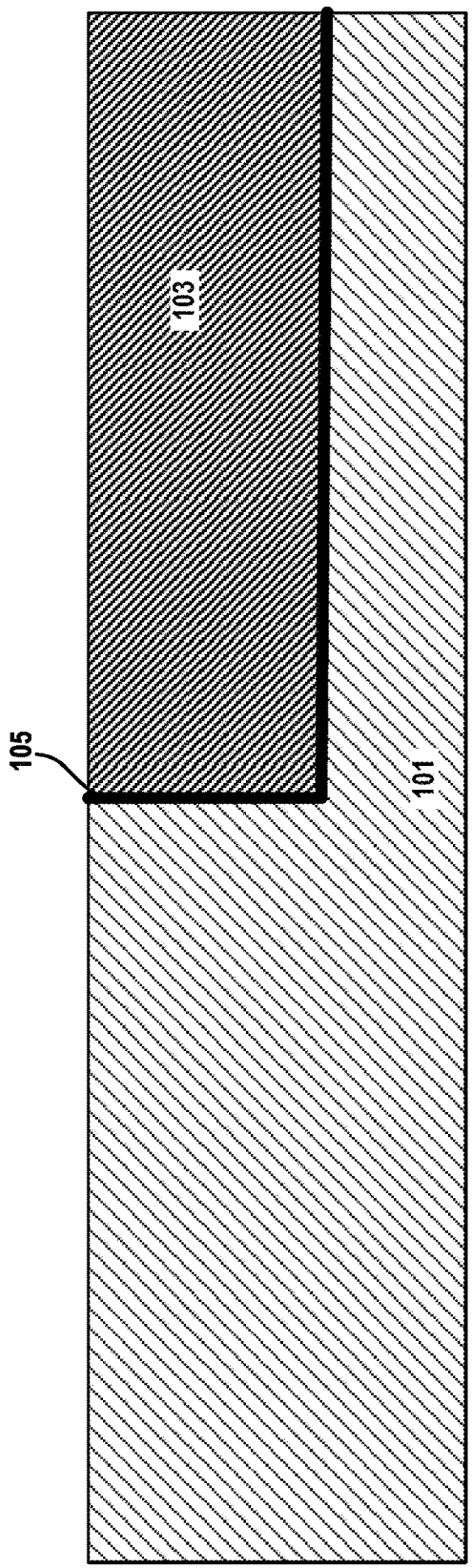
FIG. 2 is a cross-sectional diagram depicting the substrate after patterning, etching and deposition steps to define the capacitor area have been performed according to a first embodiment of the invention.

FIG. 2 is a cross-sectional diagram depicting the substrate after patterning, etching and deposition steps to define the capacitor area have been performed according to a first embodiment of the invention. As is known, to form such a pattern or recess in a dielectric, a photoresist, hardmask or sacrificial mandrel layer can be patterned over the low-k dielectric layer 101. The subsequent etch will create a recessed region containing a thinned low-k dielectric over which the high-k dielectric 103 is deposited. Optionally, a liner material 105 can be deposited between low-k dielectric 101 and high-k dielectric 103. The liner layer 105 can be, for example, SiN, SiO, SiC, SiC(N,H) or combination of the same.

In one embodiment, high-k dielectric 103 is a phase change material. In preferred embodiments of the invention, the phase change material is an alloy which is a doped metallic insulator selected from a nitrogen doped metallic insulator, an oxygen doped metallic insulator or a nitrogen and oxygen doped metallic insulator. That is, in one embodiment, the high-k dielectric may include a nitrogen-doped metallic insulator that is composed of nitrogen, N, and a metal, M. In another embodiment, high-k dielectric 103 may include an oxygen-doped metallic insulator that is composed of oxygen, O, and a metal, M. In yet another embodiment, high-k dielectric 103 may include a nitrogen- and oxygen-doped metallic insulator that is composed of nitrogen, N, oxygen, O, and a metal M. In any of the above mentioned embodiments, metal, M, is a ohmic material such as, for example, titanium (Ti), tantalum (Ta), ruthenium (Ru), tungsten (W), platinum (Pt), cobalt (Co), rhodium (Rh) and manganese (Mn).

In preferred embodiments of the invention, the high-k dielectric layer 103 is a nitrogen-doped metallic insulator which is an alloy of tantalum and nitrogen, e.g., Ta3N5. A Ta3N5 layer 103 can be formed by a conventional deposition process including, for example, chemical vapor deposition (CVD), plasma enhanced chemical vapor deposition (PECVD), atomic layer deposition (ALD), physical vapor deposition (PVD), sputtering, chemical solution deposition and plating. In preferred embodiments, the thickness of the Ta3N5 layer will be sufficient to fill the capacitor region defined over the thinned low-k dielectric and the liner layer 105. The thickness of the Ta3N5 layer is in the range of 50 nm to 1000 nm, with a thickness from 200 nm to 500 nm being more typical. As illustrated, the Ta3N5 deposition layer 103 is substantially conformal over the capacitor area. A planarization step is used to remove excess Ta3N5 and liner layer which are deposited outside the capacitor area, e.g., over the field areas of the low-k dielectric 101.

Figure 3:
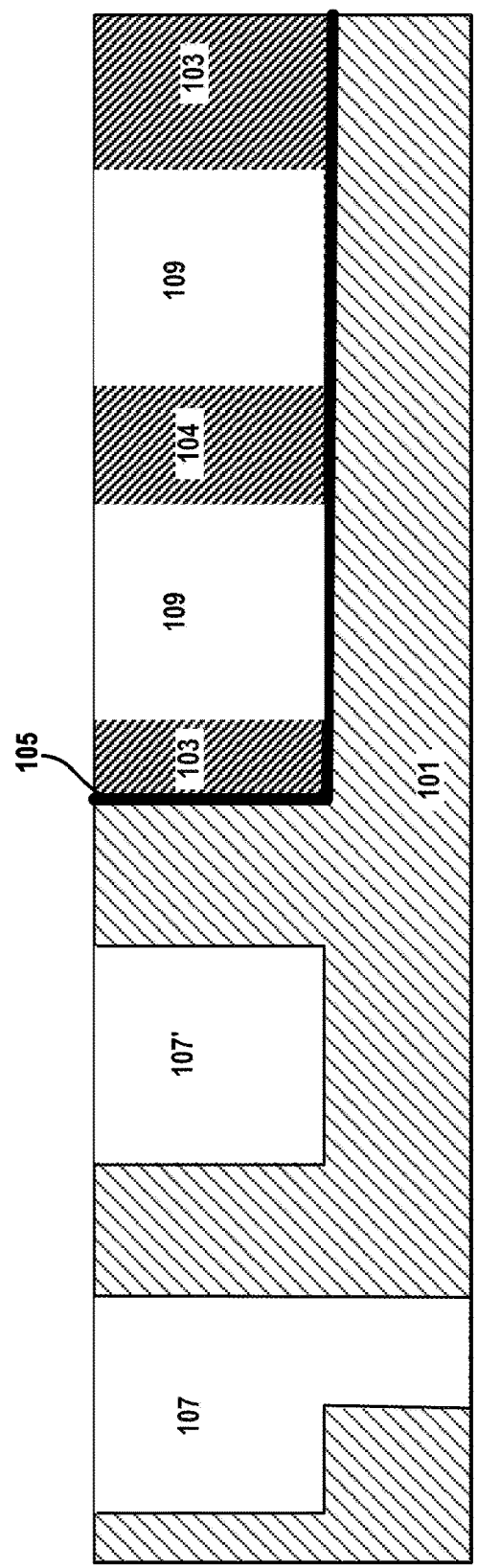
FIG. 3 is a cross-sectional diagram depicting the substrate after a second patterning and etching for interconnects and MIM capacitor have been performed according to a first embodiment of the invention.

FIG. 3 is a cross-sectional diagram depicting the features formed in the low-k dielectric material 101 and high-k dielectric material 103 after patterning and etching steps have been performed according to a first embodiment of the invention. This drawing shows patterning the interconnect area in the low-k dielectric 101 and the MIM capacitor in the high-k, phase change dielectric material 103, 104 together. This allows some of the masks to be shared in patterning both the interconnects and capacitors. The interconnect area could include a dual-damascene structures 107, where both a conductive line and via are patterned, or single-damascene structures 107', where only the conductive line level is patterned. As shown, the conductive line level and the metal plates for the capacitor can share a mask. The high-k dielectric features 109 are where the metal plates of the MIM capacitor will be formed. The portion of the high-k dielectric 104 between the high-k dielectric features 109 is the insulator of the MIM capacitor. The insulator 104 between the two plates is vertically oriented and can be formed using a hardmask or sidewall mandrel. As will be described in association with FIG. 4, the high-k insulator 104 can be thinned to a thickness smaller than that allowed by the sidewall patterning alone. Although only four features 107, 109 are shown for ease in illustration, the patterned dielectric structure could be more complicated and include a set of vias, a set of trenches, or combination of the same in different embodiments of the invention.

Figure 4:
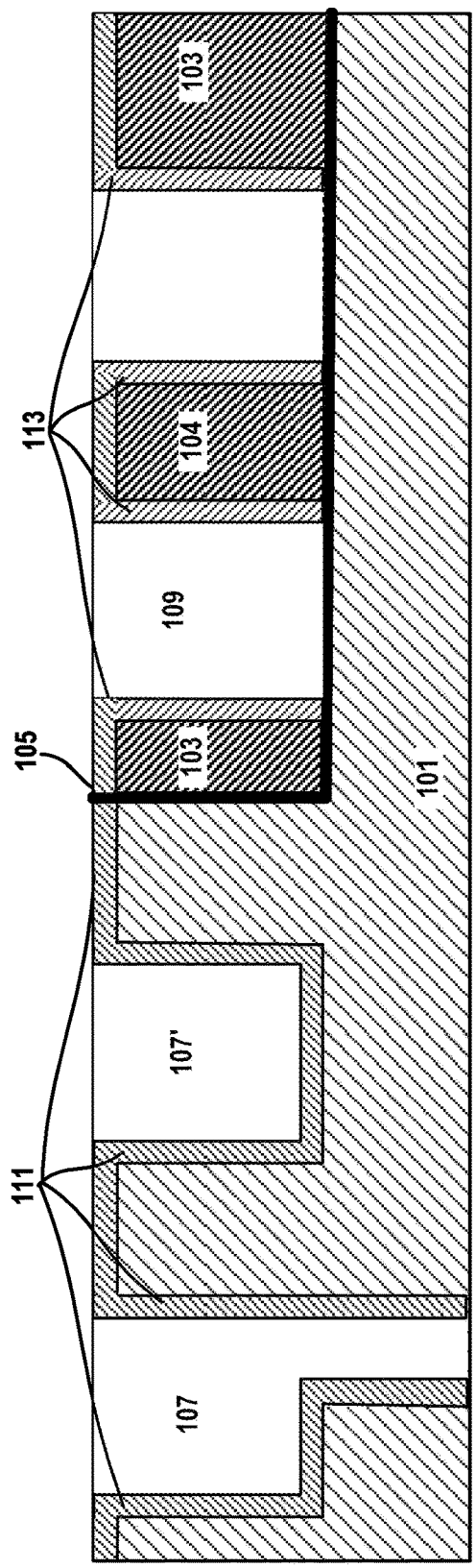
FIG. 4 is a cross-sectional diagram depicting the structure after a controlled surface treatment step has been performed on the low-k and high-k insulator layers according to a first embodiment of the invention.

FIG. 4 is a cross-sectional diagram depicting the structure after a controlled surface treatment step has been performed on the low-k dielectric layer 101 and the high-k dielectric layer 103 according to a first embodiment of the invention. In the low-k dielectric layer, a densified surface layer 111 is created, wherein a higher concentration of a selected element is produced as compared to the original low-k dielectric 101. In the preferred embodiments in which the high-k insulator 103 is Ta3N5, the surface treatment converts the deposited high-k to metallic TaN. The densified surface layer 111 and the TaN layer 113 are created utilizing a plasma, neutral atom beam or gas cluster (GCIB) process which converts the Ta3N5 to TaN in the surface portion of the original layer. The chemicals used in the process include N, Si, C and O containing chemicals. Such as SiH4, N2, NH3, CH4, C2H2, O3 and mixture with H2, He, Ar. In alternative embodiments of the invention, the surface treatment process converts the doped metallic insulator to a respective one of a metallic nitride, a metallic oxide, and a metallic nitride-oxide.

A densified surface in the low-k interconnect region enhances adhesion to the later deposited liner material, which is critical for the total interconnect reliability. Further, the controlled surface treatment converts surface of the Ta3N5 to TaN which is electrically conductive. In preferred embodiment, the vertically oriented, high-k Ta3N5 layer 104 which will serve as the insulator of the MIM capacitor is thinned by the two layers of TaN 113 on either side of the insulator 104. This allows the formation of an insulator thinner than can be accomplished by sidewall technology alone. Because both sidewall technology and the surface treatment are well controlled, the insulator uniformity is well controlled, uniform and ultra-thin. An ultra-thin high-k dielectric is a preferred structure for a high performance capacitor device. Although the width of the insulator is depicted relatively wide for ease of illustration, in embodiments of the invention, the insulator will have a thickness in the range of 0.2 nm to 50 nm with a range of 2 nm to 10 nm being more preferred.

When a plasma nitridation process is employed as the surface treatment, an electrical bias of greater than 200 W can be employed. The plasma process is performed by generating a plasma from an ambient containing at least one of, but not limited to, He, Ne, Ar, N2, H2 and mixtures thereof. In one embodiment, the plasma nitridation process employed in the present application is performed at a temperature from 50° C. to 450° C. In another embodiment, the plasma nitridation process employed in the present application is performed at a temperature from 100° C. to 300° C.

The controlled surface treatment of the high-k Ta3N5 heats the material causing a phase change in the tantalum nitrogen alloy to a higher conductivity phase like TaN. The Ta3N5 phase of the tantalum nitrogen alloy may be referred to as an orthorhombic phase (or Amorphous), which may be considered as a dielectric material. The TaN phase of the tantalum nitrogen alloy may be referred to as a cubic or hexagonal phase, and may be considered an electrical conductor.

Thermally heating the nitrogen-doped metal layer (through a controlled surface treatment) can change crystal structure. The change in crystal structure changes the nitrogen (N) to tantalum (Ta) ratio in the nitrogen-doped metal layer to convert the material layer from its insulating phase to an electrically conductive phase. For example, thermally heating the phase change material layer (through a controlled surface treatment) to cause a phase change from an insulating Orthorhombic crystal structure (or Amorphous), e.g., Ta3N5 composition to an electrically conductive Cubic or hexagonal crystal structure, e.g., TaN composition. In other embodiments of the invention, where oxygen-doped metal or nitrogen-oxygen doped metal layers are used, the materials will go through a similar transformation at a surface layer from an insulator to an electrically conducting material.

Figure 5:
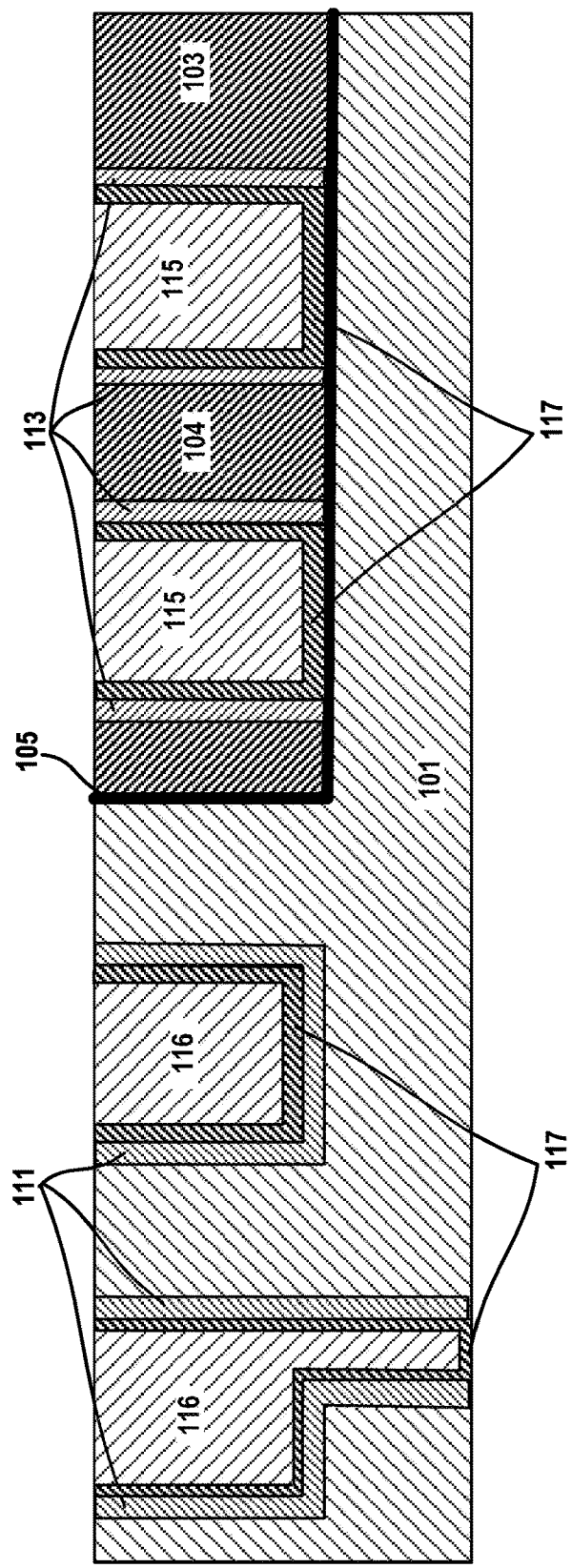
FIG. 5 is a cross-sectional diagram depicting the structure after a metal fill deposition and planarization step have been performed according to a first embodiment of the invention.

FIG. 5 is a cross-sectional diagram depicting the substrate structure after a liner deposition step, a metal deposition step and planarization step have been performed according to a first embodiment of the invention. In these steps, both the metal plates of the capacitor and the conductive lines are formed. The metal capacitor plates of the MIM capacitor include the conductive TaN layer 113, the liner layer 117 and the metal layer 115. The insulator of the MIM capacitor includes the insulator of the capacitor is the vertically oriented layer of Ta3N5 104 which has been thinned by the surface treatment. Thus, a portion of the nitrogen-doped metal forms the insulator of the capacitor while another portion of the nitrogen-doped metal forma a portion of the capacitor plate. The conductive lines include the liner layer 117 and the metal layer 116. In preferred embodiments of the invention, the metal material 115, 116 is selected from the group of Cu, Al, Ta, Ti, W, Co, their nitride alloys or a combination of the same deposited. In preferred embodiments, the liner layer 117 can be selected from the group of Ta(N), Ti(N), W(N), Co(N,P,W), Ru(N,P,W), although other materials can be used in alternative embodiments.

The metal material 115, 116 and the liner material 117 are deposited utilizing any conventional deposition process including, for example, chemical vapor deposition (CVD), plasma enhanced chemical vapor deposition (PECVD), physical vapor deposition (PVD) or sputtering. The thickness of the metal deposited can vary according to the depth of the features, the type of layer being formed and the technique used in forming the same. In preferred embodiments, the thickness of the metal layer 115 is at least sufficient complete the feature fill of the voids 107, 109 shown in FIG. 4. In preferred embodiments, the thickness of the metal layer 115 will be in the range of 50 nm to 1000 nm, with a thickness from 200 nm to 500 nm being more typical. The thickness of the liner layer 117 is in the range of 0.5 nm to 200 nm with a thickness from 1 nm to 100 nm being more typical The drawing depicts the structure after a planarization process such as a chemical mechanical polishing (CMP) step has been performed according to a first embodiment of the invention. Typically, a CMP process uses an abrasive and corrosive chemical slurry (commonly a colloid) in conjunction with a polishing pad. The pad and wafer are pressed together by a dynamic polishing head and held in place by a plastic retaining ring. As shown, the CMP step has removed the excess portions of the converted metallic layer 113, the liner layer 117 and the metal layer 115, 116 in the field areas of the low-k dielectric layer 101 and the high-k dielectric layer 103 outside the features of the patterns in the respective dielectrics. Other planarization processes are known to the art and are used in alternative embodiments of the invention.

Figure 6:
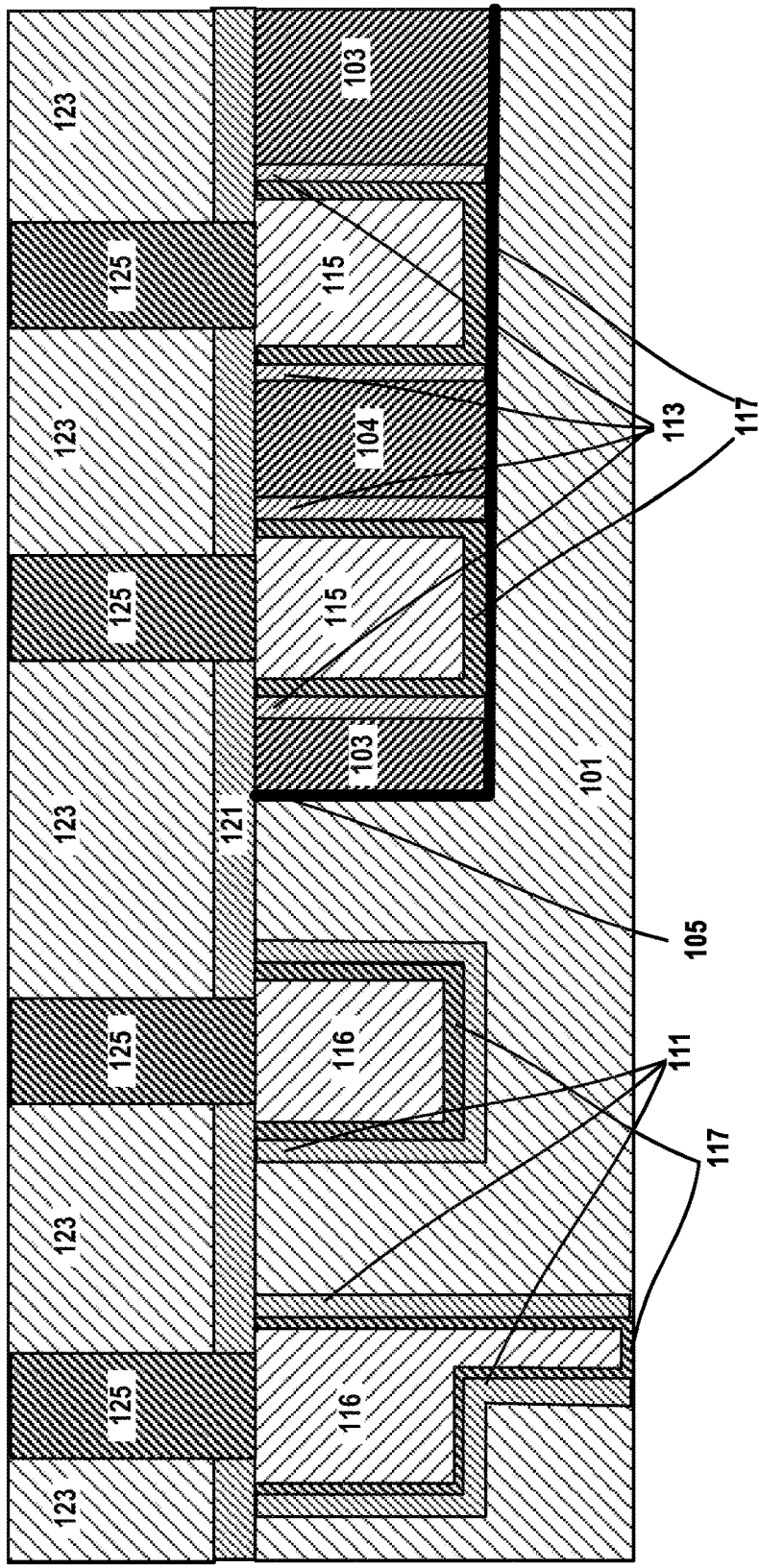
FIG. 6 is a cross-sectional diagram depicting the structure after the contact metallurgy has been formed according to a first embodiment of the invention.

FIG. 6 is a cross-sectional diagram depicting the structure after connectors have been formed according to a first embodiment of the invention.

In this embodiment, a dielectric capping layer 121 is deposited over the structure depicted in FIG. 5. The dielectric capping layer 121 is Si3N4 in one preferred embodiment. However, other dielectrics such as SiC, SiO2, SiC(N, H) or combination of the same may be used in alternative embodiments. The dielectric capping layer 121 can be deposited in a conventional deposition process such as a low pressure chemical vapor deposition (LPCVD) process or any other suitable deposition technique.

Next, a dielectric layer 123 is deposited over the dielectric capping layer 121. In a preferred embodiment, the dielectric layer 123 is comprised of the same dielectric as the low-k dielectric layer 101, e.g., silicon dioxide. Deposition of the 123 can be through a CVD, spin on or other deposition process. Then, a mask is patterned over the dielectric layer 123 and contact holes are etched through the dielectric layer 123 and second dielectric layer 121. The mask is removed, and the contact holes are filled with a connector metal layer 125. The metal selected for the connectors 125 may be the same as used for metal layer 1115, 116, i.e. selected from Cu, Al, W, Co, Rh, Ni, Rh, Ta, Ti, their nitrides and a combination thereof. Deposition of the connector metal layer 125 can be accomplished utilizing any conventional deposition process as discussed above. A planarization step is performed to remove excess connector metal from the field areas and prepare the connectors 125 for additional metal layers.

Figure 7:
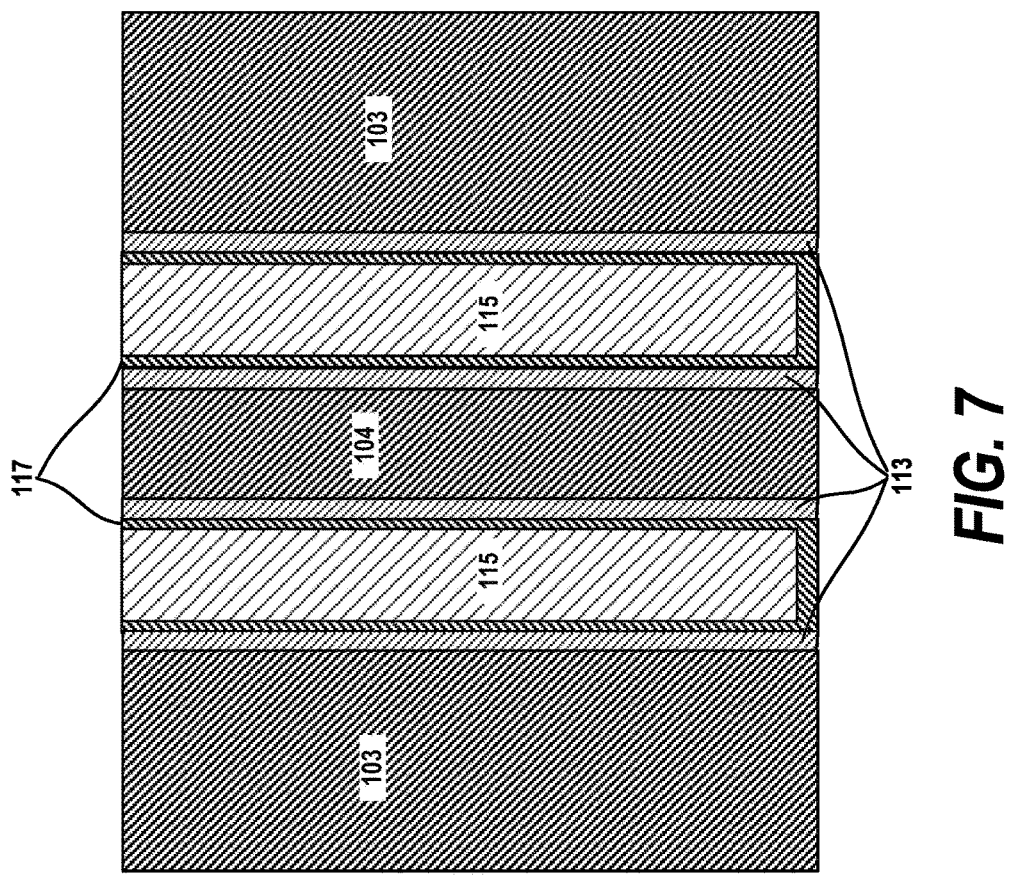
FIG. 7 is a top view diagram depicting the capacitor structure with a high-k dielectric between two adjacent metal lines after the metal fill deposition has been performed according to a first embodiment of the invention.

FIG. 7 is a top view diagram depicting the capacitor structure from FIG. 5 after the metal fill deposition and chemical mechanical polishing (CMP) steps have been performed according to the first embodiment of the invention. The capacitor structure includes with a high-k insulator 104 between two adjacent metal plates formed from metal 115, liner 117 and TaN layer 113.

FIG. 8 is a top view diagram depicting another structure after the metal fill deposition and planarization steps have been performed according to a second embodiment of the invention. In this embodiment, the trenches are joined together to form a serpentine pattern. Such a serpentine pattern combined with the depth of the trenches increases the size of the capacitor, thus increasing the charge carrying capability or capacitance of the capacitor for a given chip area. The capacitor structure includes with a high-k insulator 104 between two adjacent metal plates with connecting fingers formed from metal 115, liner and TaN layer. For ease in illustration, the liner and TaN layer are shown as a single combined layer 114.

Processing of additional layers of the integrated circuit device proceeds after the steps illustrated in the disclosure. For example, a second set of conductive lines could be created using an embodiment of the invention in subsequent steps if required for completion of the integrated circuit.

The resulting structure can be included within integrated circuit chips, which can be distributed by the fabricator in wafer form (that is, as a single wafer that has multiple chips), as a bare die, or in a packaged form. In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Embodiments of the invention provides a reduced insulator thickness by converting a surface portion of the insulator to a metallic material. A uniform ultra-thin insulator thickness is thus produced through a "controlled" surface treatment. This is in contrast to conventional processes in which the high-k dielectric thickness is controlled through the control of the deposition process. In embodiments of the invention, the final high-k thickness is through amount of surface treatment to reduce the original deposited high-k material.

While only one or a limited number of features are illustrated in the drawings, those ordinarily skilled in the art would understand that many different types of features could be simultaneously formed with the embodiment herein and the drawings are intended to show simultaneous formation of multiple different types of features. However, the drawings have been simplified to only show a limited number of features for clarity and to allow the reader to more easily recognize the different features illustrated. This is not intended to limit the invention because, as would be understood by those ordinarily skilled in the art, the invention is applicable to structures that include many of each type of feature shown in the drawings.

While the above describes a particular order of operations performed by certain embodiments of the invention, it should be understood that such order is exemplary, as alternative embodiments may perform the operations in a different order, combine certain operations, overlap certain operations, or the like. References in the specification to a given embodiment indicate that the embodiment described may include a particular feature, structure, or characteristic, but every embodiment may not necessarily include the particular feature, structure, or characteristic.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of Having described our invention, what we now claim is as follows:

1. A method for fabricating an advanced metal insulator metal capacitor structure comprising:
   providing a pattern in a dielectric layer, wherein the dielectric layer includes a low-k dielectric region and a high-k dielectric region including a phase change material which is a high-k insulator in a deposited state, wherein the pattern includes a first set of features in the low-k dielectric region and a second set of features in the high-k dielectric region;
   performing a surface treatment process on the phase change material to produce a top surface layer having electrically conductive properties;
   depositing a metal layer in the first and second set of features, thereby forming a set of conductive lines in the low-k dielectric region and a metal insulator metal capacitor in the high-k dielectric region.

2. The method as recited in claim 1, wherein the phase change material has insulating properties and an orthorhombic phase prior to the surface treatment and wherein the top surface layer of the phase change material has electrically conductive properties and an Cubic or hexagonal phase following said surface treatment.

3. The method as recited in claim 1, wherein the set of features are a set of trenches in the dielectric layer.

4. The method as recited in claim 1, wherein the metal layer is deposited on field areas of the dielectric in addition to in the first and second set of features and the method further comprises removing the metal layer on field areas of the dielectric layer using a planarization process.

5. The method as recited in claim 1, wherein the surface treatment is selected from the group of a plasma process, a neutral atom beam process and a gas cluster (GCIB) process.

6. The method as recited in claim 1, wherein the patterning further comprises:
   depositing a low-k dielectric layer on a substrate;
   patterning a layer over the low-k dielectric layer exposing an area in the low-k dielectric;
   etching the exposed area in the low-k dielectric layer to form a thinned low-k layer region; and
   depositing the phase change material over the thinned low-k layer.

7. The method as recited in claim 1, wherein a set of metal plates of the capacitor are composed of the metal layer and the top surface layer having electrically conductive properties and the insulator of the capacitor is a vertically oriented layer of the phase change material which has been thinned by the surface treatment.

8. The method as recited in claim 1, wherein the phase change material is a doped metallic insulator selected from a nitrogen doped metal, an oxygen doped metal or a nitrogen and oxygen doped metal, and the surface treatment process converts the doped metallic insulator to a respective one of a metallic nitride, a metallic oxide and a metallic nitride-oxide.

9. The method as recited in claim 8, wherein the phase change material is deposited as $Ta_3N_5$ and wherein the surface treatment converts the top surface layer of the phase change material to TaN.

10. The method as recited in claim 9, wherein a set of metal plates of the capacitor are composed of the metal layer and the TaN top surface layer and the insulator of the capacitor is a vertically oriented layer of $Ta_3N_5$ which has been thinned by the surface treatment.

* * * * *